United States Patent
Koo et al.

(10) Patent No.: US 8,993,377 B2
(45) Date of Patent: Mar. 31, 2015

(54) SEMICONDUCTOR DEVICE AND METHOD OF BONDING DIFFERENT SIZE SEMICONDUCTOR DIE AT THE WAFER LEVEL

(75) Inventors: Jun Mo Koo, Singapore (SG); Pandi C. Marimuthu, Singapore (SG); Seung Wook Yoon, Singapore (SG); Il Kwon Shim, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 46 days.

(21) Appl. No.: 13/231,839

(22) Filed: Sep. 13, 2011

(65) Prior Publication Data
US 2012/0074587 A1    Mar. 29, 2012

Related U.S. Application Data

(60) Provisional application No. 61/387,595, filed on Sep. 29, 2010.

(51) Int. Cl.
*H01L 21/56* (2006.01)
*H01L 25/07* (2006.01)
(Continued)

(52) U.S. Cl.
CPC .............. *H01L 24/96* (2013.01); *H01L 21/561* (2013.01); *H01L 21/563* (2013.01); *H01L 21/565* (2013.01); *H01L 21/568* (2013.01); *H01L 21/6835* (2013.01); *H01L 21/76898* (2013.01); *H01L 23/3107* (2013.01); *H01L 23/3128* (2013.01); *H01L 24/03* (2013.01); *H01L 24/05* (2013.01); *H01L 24/11* (2013.01); *H01L 24/13* (2013.01); *H01L 24/16* (2013.01); *H01L 24/17* (2013.01); *H01L 24/19* (2013.01); *H01L 24/20* (2013.01); *H01L 24/29* (2013.01); *H01L 24/32* (2013.01); *H01L 24/81* (2013.01); *H01L 24/82* (2013.01); *H01L 24/95* (2013.01); *H01L 25/0657* (2013.01); *H01L 25/105* (2013.01);
(Continued)

(58) Field of Classification Search
USPC ........... 257/E21.499, E21.502; 438/107, 108, 438/109, 125, 126, 128, 667, 672, 675
See application file for complete search history.

(56) References Cited

U.S. PATENT DOCUMENTS 6,107,164 A    8/2000  Ohuchi
6,322,903 B1   11/2001 Siniaguine et al.
(Continued)

*Primary Examiner* — Peniel M Gumedzoe
(74) *Attorney, Agent, or Firm* — Robert D. Atkins; Patent Law Group: Atkins and Associates, P.C.

(57) ABSTRACT

A semiconductor wafer has first and second opposing surfaces. A plurality of conductive vias is formed partially through the first surface of the semiconductor wafer. The semiconductor wafer is singulated into a plurality of first semiconductor die. The first semiconductor die are mounted to a carrier. A second semiconductor die is mounted to the first semiconductor die. A footprint of the second semiconductor die is larger than a footprint of the first semiconductor die. An encapsulant is deposited over the first and second semiconductor die and carrier. The carrier is removed. A portion of the second surface is removed to expose the conductive vias. An interconnect structure is formed over a surface of the first semiconductor die opposite the second semiconductor die. Alternatively, a first encapsulant is deposited over the first semiconductor die and carrier, and a second encapsulant is deposited over the second semiconductor die.

28 Claims, 18 Drawing Sheets

(51) Int. Cl.
*H01L 23/00* (2006.01)
*H01L 21/683* (2006.01)
*H01L 21/768* (2006.01)
*H01L 25/065* (2006.01)
*H01L 23/31* (2006.01)
*H01L 25/10* (2006.01)

(52) U.S. Cl.
CPC ............ *H01L 2221/68327* (2013.01); *H01L 2221/68381* (2013.01); *H01L 2221/68386* (2013.01); *H01L 2224/0231* (2013.01); *H01L 2224/02313* (2013.01); *H01L 2224/02317* (2013.01); *H01L 2224/02372* (2013.01); *H01L 2224/02381* (2013.01); *H01L 2224/0239* (2013.01); *H01L 2224/024* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/04042* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/06131* (2013.01); *H01L 2224/1132* (2013.01); *H01L 2224/11334* (2013.01); *H01L 2224/1134* (2013.01); *H01L 2224/1145* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/13025* (2013.01); *H01L 2224/131* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/1403* (2013.01); *H01L 2224/14181* (2013.01); *H01L 2224/16146* (2013.01); *H01L 2224/1703* (2013.01); *H01L 2224/17181* (2013.01); *H01L 2224/21* (2013.01); *H01L 2224/2105* (2013.01); *H01L 2224/215* (2013.01); *H01L 2224/22* (2013.01); *H01L 2224/221* (2013.01); *H01L 2224/29144* (2013.01); *H01L 2224/2919* (2013.01); *H01L 2224/48105* (2013.01); *H01L 2224/48175* (2013.01); *H01L 2224/48228* (2013.01); *H01L 2224/73204* (2013.01); *H01L 2224/73265* (2013.01); *H01L 2224/81005* (2013.01); *H01L 2224/81815* (2013.01); *H01L 2224/831* (2013.01); *H01L 2224/95001* (2013.01); *H01L 2224/96* (2013.01); *H01L 2225/06513* (2013.01); *H01L 2225/06541* (2013.01); *H01L 2225/1052* (2013.01); *H01L 2225/1058* (2013.01); *H01L 2924/01004* (2013.01); *H01L 2924/01013* (2013.01); *H01L 2924/01029* (2013.01); *H01L 2924/01047* (2013.01); *H01L 2924/01049* (2013.01); *H01L 2924/01073* (2013.01); *H01L 2924/01078* (2013.01); *H01L 2924/01079* (2013.01); *H01L 2924/01082* (2013.01); *H01L 2924/014* (2013.01); *H01L 2924/1205* (2013.01); *H01L 2924/1206* (2013.01); *H01L 2924/1207* (2013.01); *H01L 2924/1433* (2013.01); *H01L 2924/14335* (2013.01); *H01L 2924/1434* (2013.01); *H01L 2924/15311* (2013.01); *H01L 2924/15331* (2013.01); *H01L 2924/01006* (2013.01); *H01L 2924/0105* (2013.01); *H01L 2924/01074* (2013.01); *H01L 2924/01322* (2013.01); *H01L 2924/13091* (2013.01); *H01L 2924/3511* (2013.01); *H01L 24/97* (2013.01); *H01L 2224/48227* (2013.01); *H01L 2924/00* (2013.01); *H01L 24/06* (2013.01); *H01L 2924/12041* (2013.01); *H01L 2924/1306* (2013.01)
USPC ............ 438/107; 257/E21.499; 257/E21.502; 438/108; 438/109; 438/125; 438/126; 438/128; 438/667; 438/672; 438/675

(56) References Cited

U.S. PATENT DOCUMENTS

| | | | |
|---|---|---|---|
| 6,534,387 | B1 | 3/2003 | Shinogi et al. |
| 6,649,445 | B1 | 11/2003 | Qi et al. |
| 7,221,059 | B2 | 5/2007 | Farnworth et al. |
| 7,553,752 | B2 | 6/2009 | Kuan et al. |
| 7,741,148 | B1 | 6/2010 | Marimuthu et al. |
| 7,880,293 | B2 | 2/2011 | Han et al. |
| 2004/0115867 | A1* | 6/2004 | Shibata .................. 438/125 |
| 2005/0186705 | A1* | 8/2005 | Jackson et al. .............. 438/106 |
| 2005/0189639 | A1* | 9/2005 | Tanie et al. .................... 257/686 |
| 2007/0007639 | A1* | 1/2007 | Fukazawa ..................... 257/686 |
| 2008/0315372 | A1 | 12/2008 | Kuan et al. |
| 2008/0316714 | A1 | 12/2008 | Eichelberger et al. |
| 2009/0045487 | A1 | 2/2009 | Jung |
| 2009/0212420 | A1 | 8/2009 | Hedler et al. |
| 2009/0302435 | A1 | 12/2009 | Pagaila et al. |
| 2010/0059855 | A1 | 3/2010 | Lin et al. |
| 2010/0065942 | A1 | 3/2010 | Lin et al. |
| 2010/0072600 | A1* | 3/2010 | Gerber ............ 257/686 |
| 2010/0078771 | A1 | 4/2010 | Barth et al. |
| 2010/0078789 | A1 | 4/2010 | Choi et al. |
| 2010/0140772 | A1 | 6/2010 | Lin et al. |
| 2010/0144094 | A1 | 6/2010 | Chen et al. |
| 2010/0308443 | A1 | 12/2010 | Suthiwongsunthorn et al. |
| 2011/0156233 | A1* | 6/2011 | Kim ........................... 257/686 |
| 2011/0159639 | A1* | 6/2011 | Yee et al. ..................... 438/109 |
| 2011/0285014 | A1* | 11/2011 | Shen et al. .................... 257/737 |

* cited by examiner

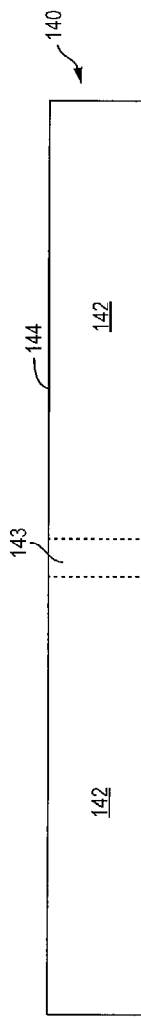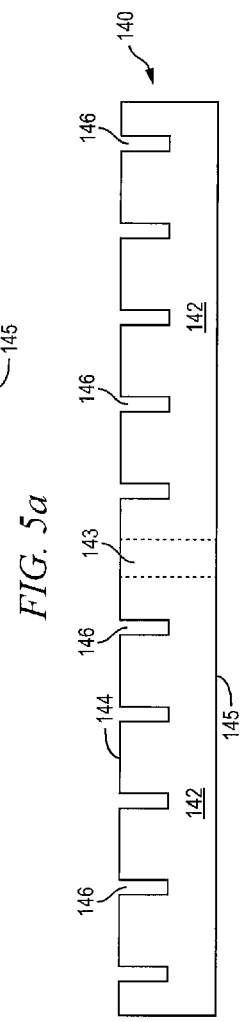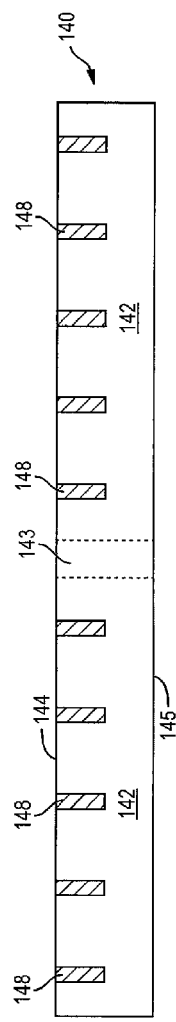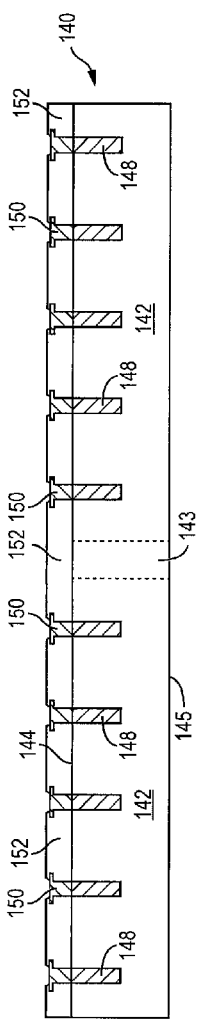

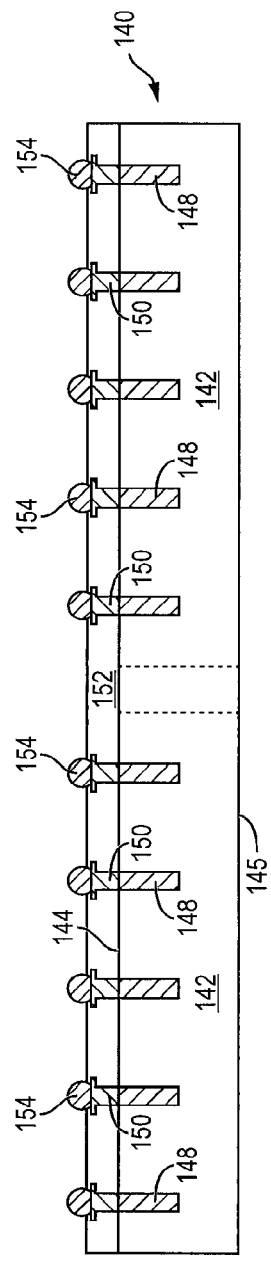
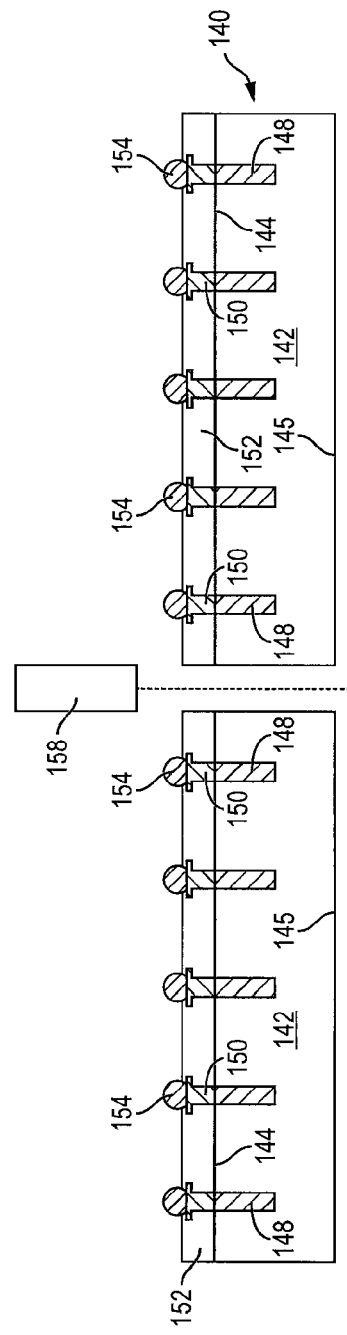

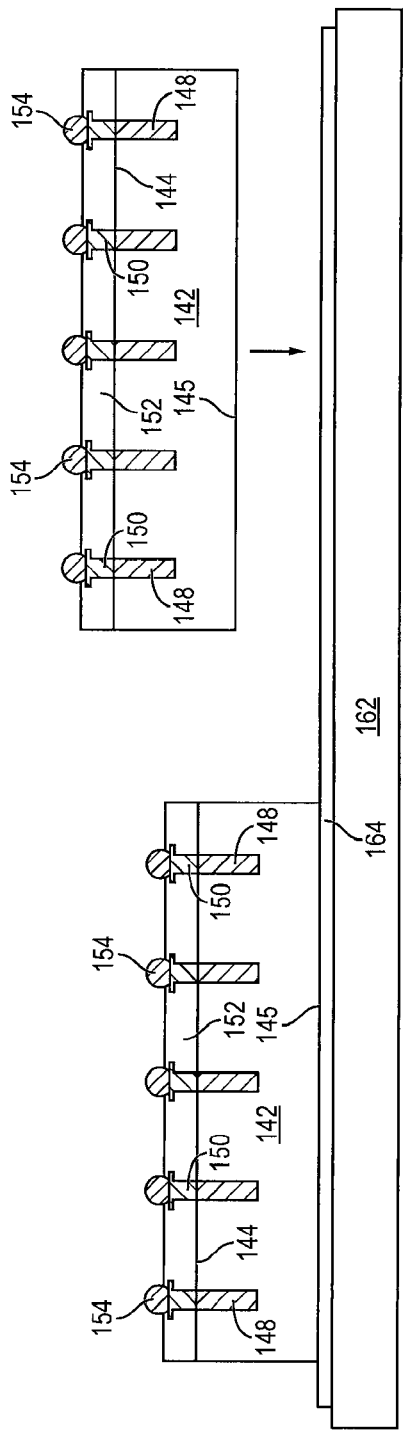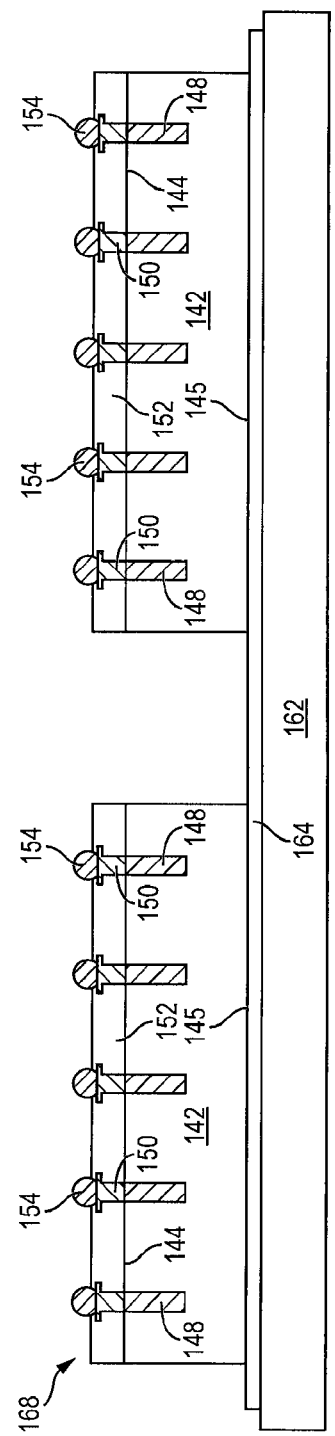

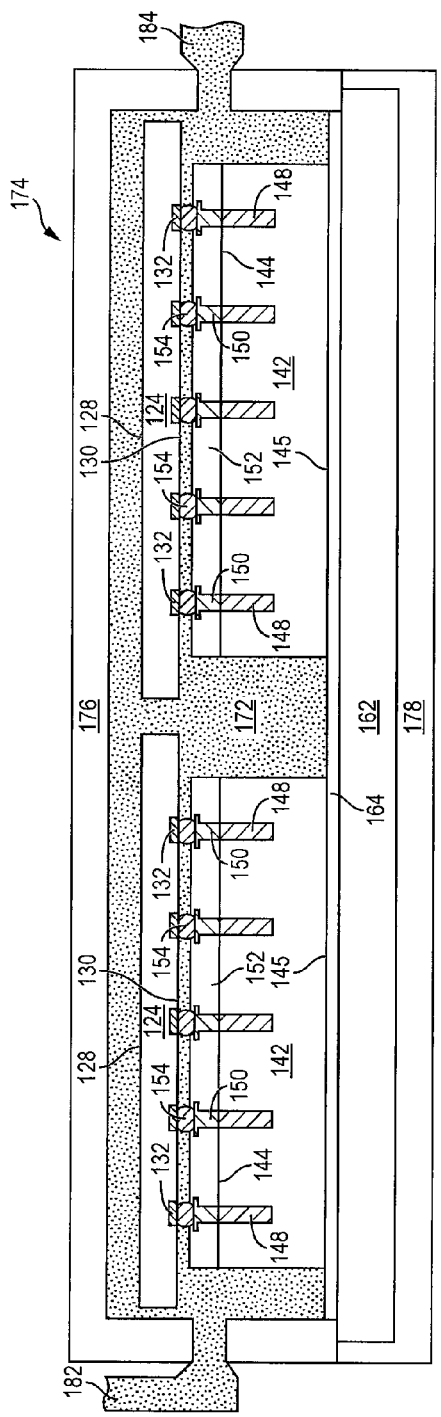
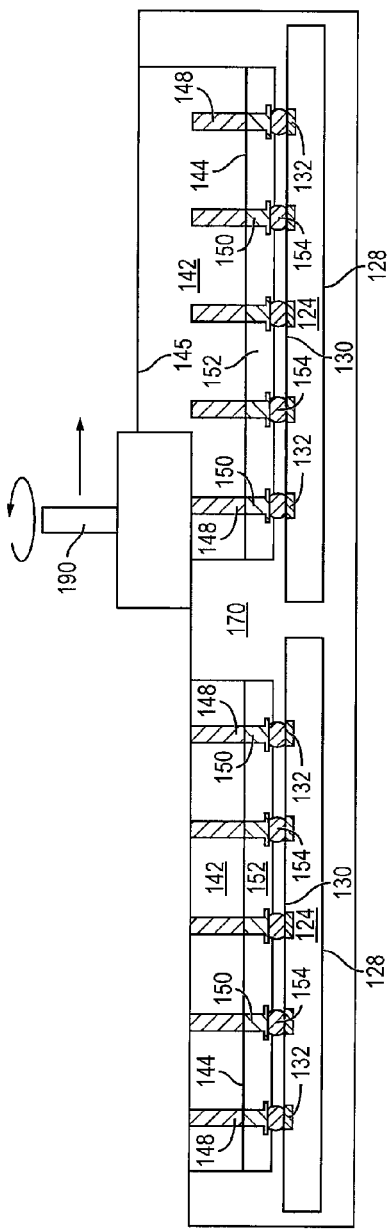
FIG. 5m
FIG. 5n

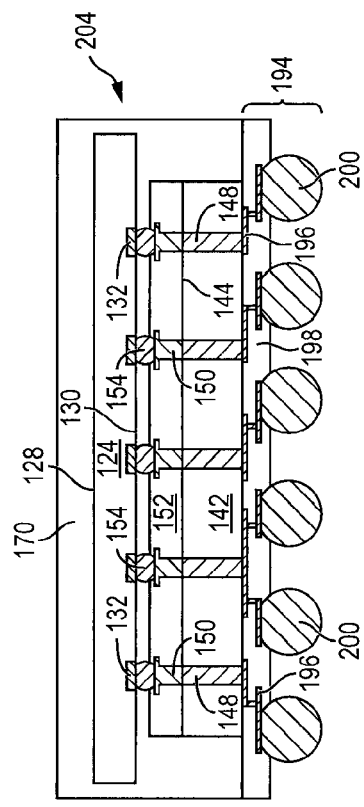
FIG. 6
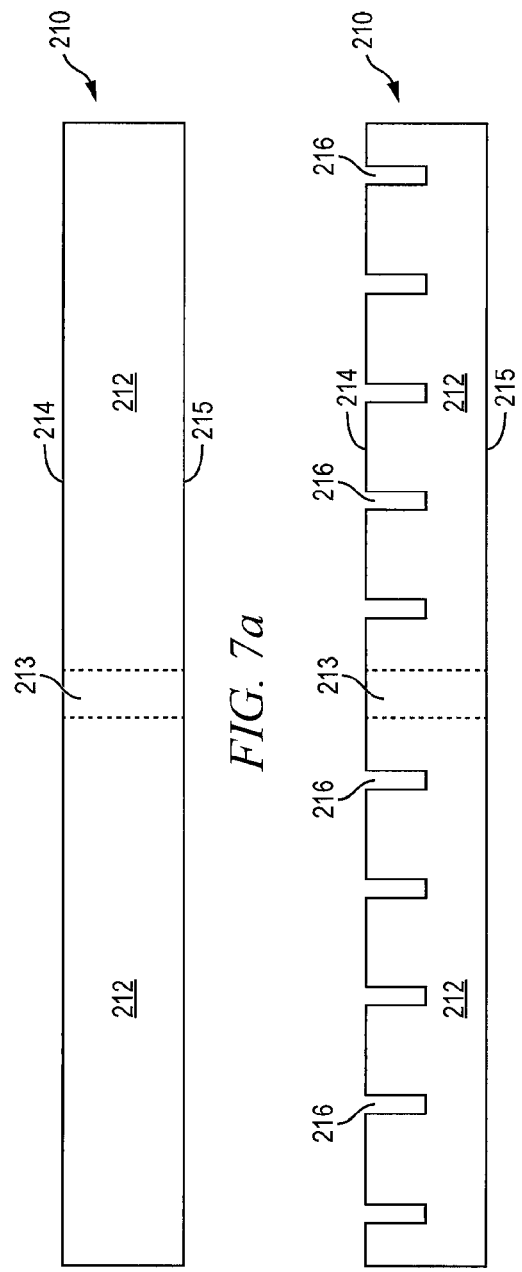
FIG. 7a
FIG. 7b

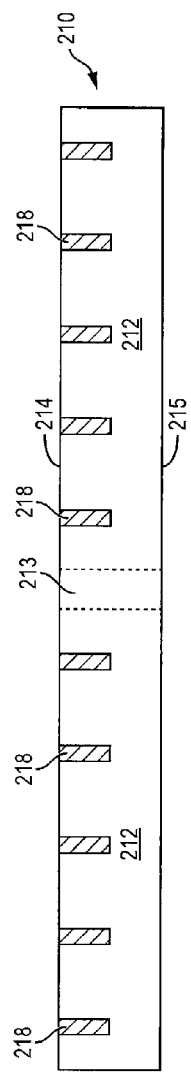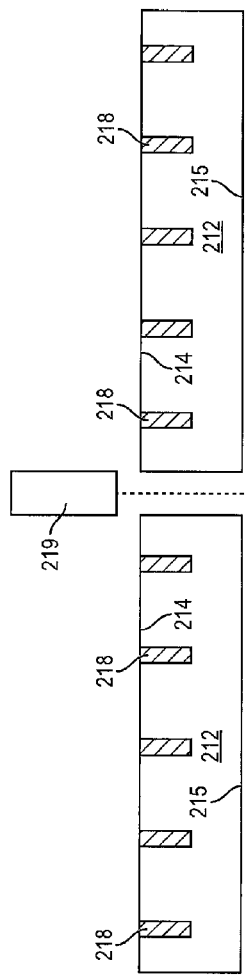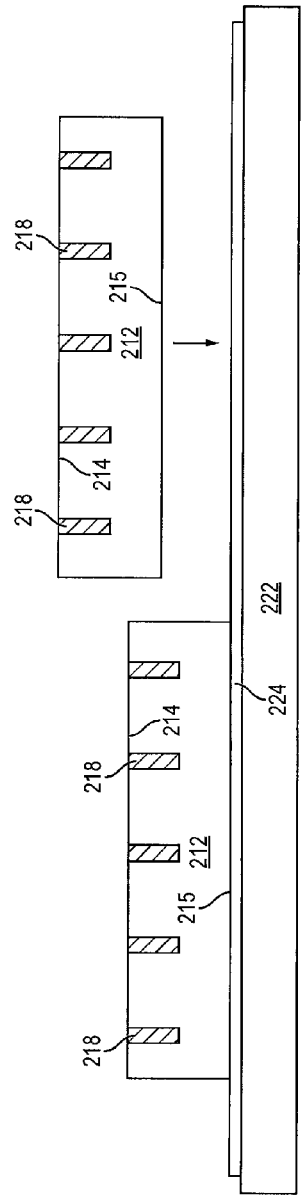
FIG. 7c
FIG. 7d
FIG. 7e

SEMICONDUCTOR DEVICE AND METHOD OF BONDING DIFFERENT SIZE SEMICONDUCTOR DIE AT THE WAFER LEVEL

CLAIM TO DOMESTIC PRIORITY

The present application claims priority to Provisional Application No. 61/387,595, filed Sep. 29, 2010, and claims priority to the above application pursuant to 35 U.S.C. §120.

FIELD OF THE INVENTION

The present invention relates in general to semiconductor devices and, more particularly, to a semiconductor device and method of bonding different size semiconductor die at the wafer level.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays.

Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

FIG. 1 shows a conventional semiconductor package 10 with semiconductor die 12 mounted to substrate 14 with bumps 16. A plurality of conductive vias 18 is formed through semiconductor die 12. Semiconductor die 20 is mounted to semiconductor die 12 with bumps 22. An encapsulant 24 is deposited over semiconductor die 12 and 20 and substrate 14. A plurality of bumps 26 is formed over a surface of substrate 14 opposite semiconductor die 12 and 20.

Semiconductor die 12 can be a logic device and semiconductor die 20 can be a large storage memory device. Consequently, semiconductor die 20 is typically larger than semiconductor die 12. The different size semiconductor die make wafer level bonding difficult. Bonding semiconductor die 20 to individual semiconductor die 12 adds manufacturing cost and can cause cracking defects from handling.

SUMMARY OF THE INVENTION

A need exists to bond different size semiconductor die at the wafer level. Accordingly, in one embodiment, the present invention is a method of making a semiconductor device comprising the steps of providing a semiconductor wafer having first and second opposing surfaces, forming a plurality of conductive vias partially through the first surface of the semiconductor wafer, singulating the semiconductor wafer into a plurality of first semiconductor die, providing a carrier, mounting the first semiconductor die to the carrier, mounting a second semiconductor die to the first semiconductor die, depositing an encapsulant over the first and second semiconductor die and carrier, removing the carrier and a portion of the second surface to expose the conductive vias, and forming an interconnect structure over a surface of the first semiconductor die opposite the second semiconductor die.

In another embodiment, the present invention is a method of making a semiconductor device comprising the steps of providing a plurality of first semiconductor die, forming a plurality of conductive vias through the first semiconductor die, providing a carrier, mounting the first semiconductor die to the carrier, mounting a second semiconductor die to the first semiconductor die, and depositing an encapsulant over the first and second semiconductor die and carrier. A footprint of the second semiconductor die is larger than a footprint of the first semiconductor die.

In another embodiment, the present invention is a method of making a semiconductor device comprising the steps of providing a plurality of first semiconductor die, forming a plurality of conductive vias through the first semiconductor die, providing a carrier, mounting the first semiconductor die to the carrier, depositing a first encapsulant over the first semiconductor die and carrier, removing the carrier, mounting a second semiconductor die to the first semiconductor die, and depositing a second encapsulant over the second semiconductor die.

In another embodiment, the present invention is a semiconductor device comprising a first semiconductor die having a plurality of conductive vias formed through the first semiconductor die. A second semiconductor die is mounted to the first semiconductor die. A footprint of the second semiconductor die is larger than a footprint of the first semiconductor die. An encapsulant is deposited over the first and second semiconductor die. An interconnect structure is formed over the first semiconductor die opposite the second semiconductor die.

BRIEF DESCRIPTION OF THE DRAWINGS

FIG. 6 illustrates a Fo-WLCSP with different size semiconductor die bonded together according to FIGS. 5a-5p;

DETAILED DESCRIPTION OF THE DRAWINGS

Figure 1:
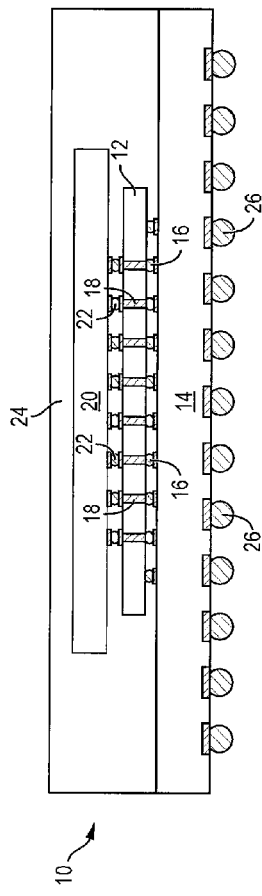
FIG. 1 illustrates a conventional Fo-WLCSP with different size semiconductor die.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
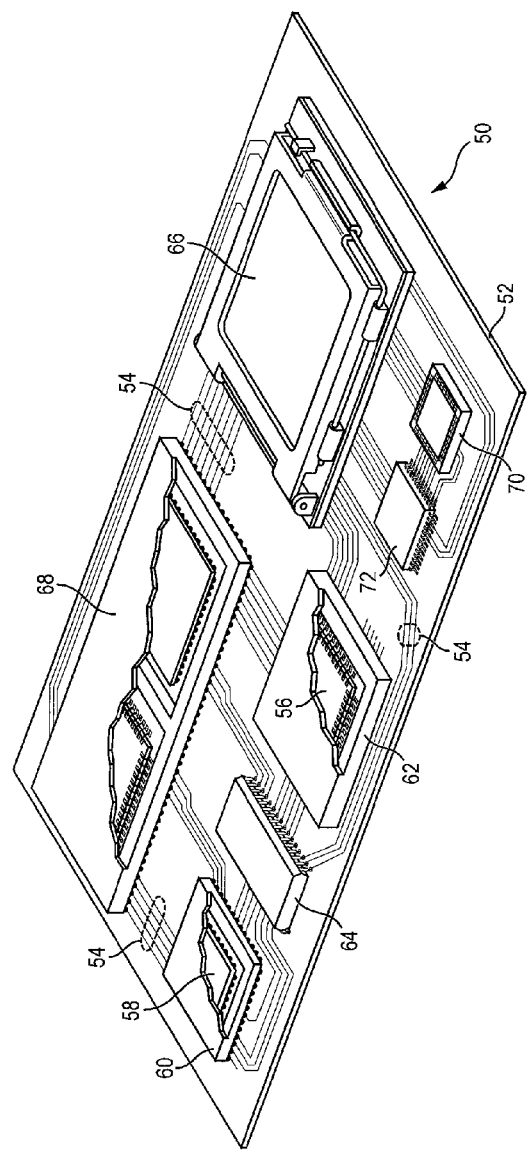
FIG. 2 illustrates a printed circuit board (PCB) with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
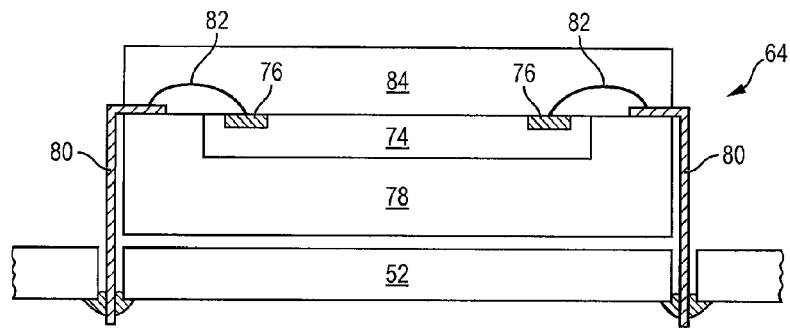
FIGS. 3a-3c illustrate further detail of the representative semiconductor packages mounted to the PCB.
Figure 3B:
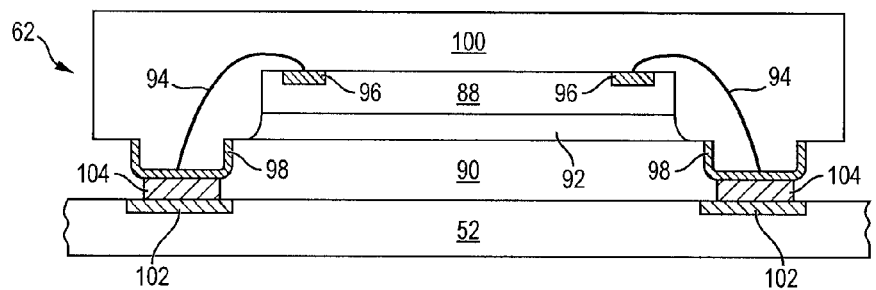
Figure 3C:
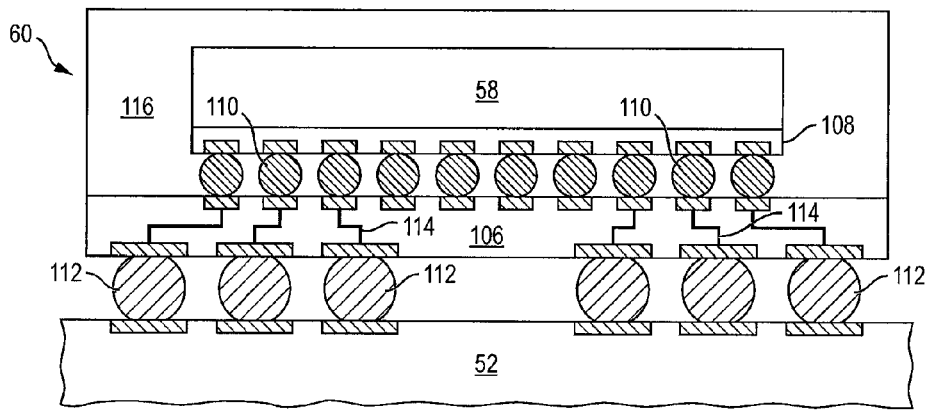

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
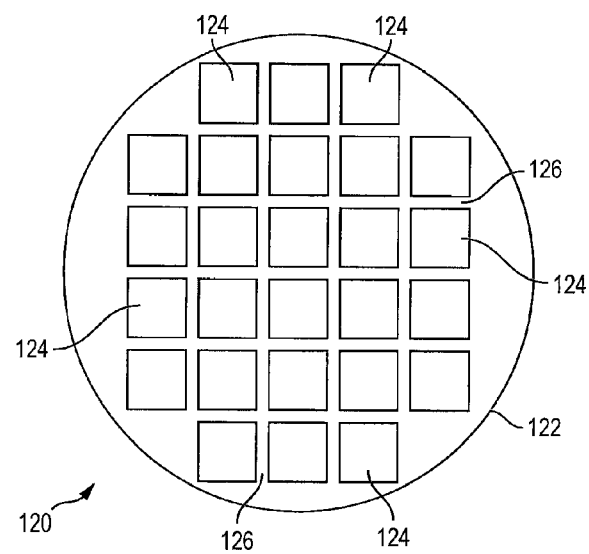
FIGS. 4a-4c illustrate a semiconductor wafer with a plurality of semiconductor die separated by a saw street.

FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124.

Figure 4B:
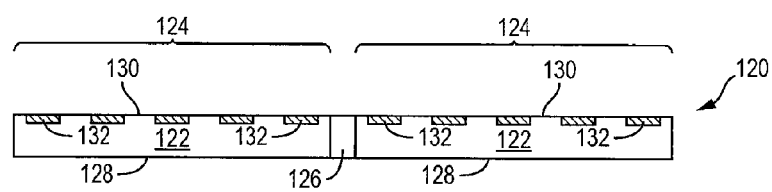

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 4b. Alternatively, contact pads 132 can be offset in multiple rows such that a first row of contact pads is disposed a first distance from the edge of the die, and a second row of contact pads alternating with the first row is disposed a second distance from the edge of the die.

Figure 4C:
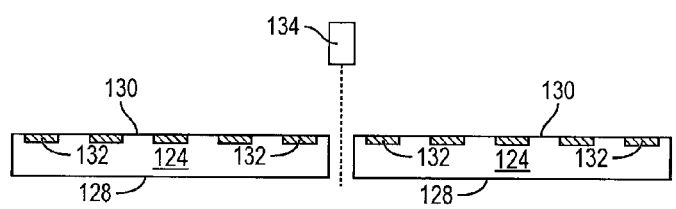

In FIG. 4c, semiconductor wafer 120 is singulated through saw street 126 using a saw blade or laser cutting tool 134 into individual semiconductor die 124.

Figure 5I:
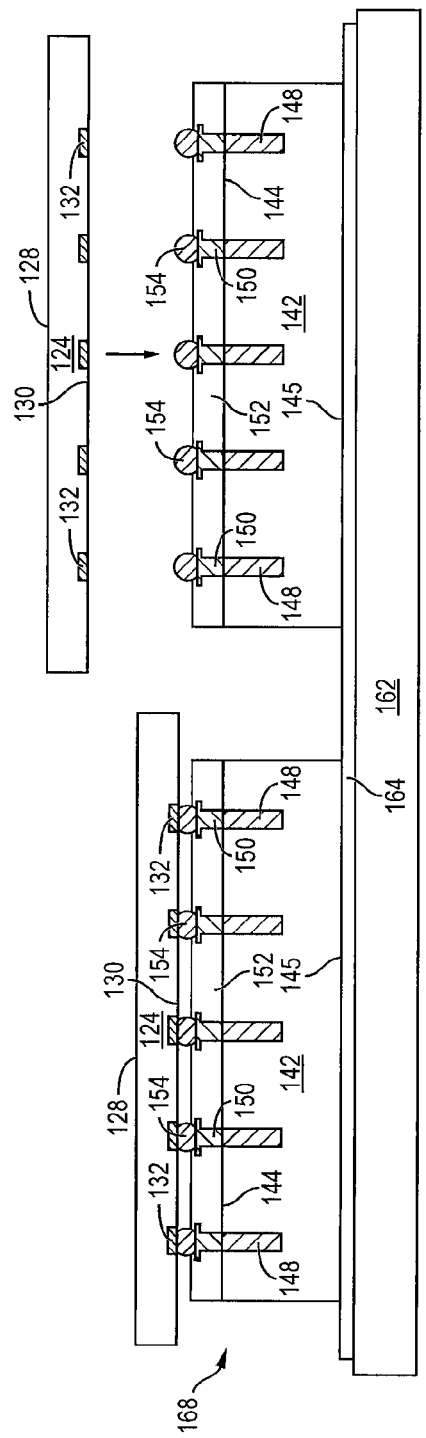
FIGS. 5a-5p illustrate a process of bonding different size semiconductor die at the wafer level.
Figure 5J:
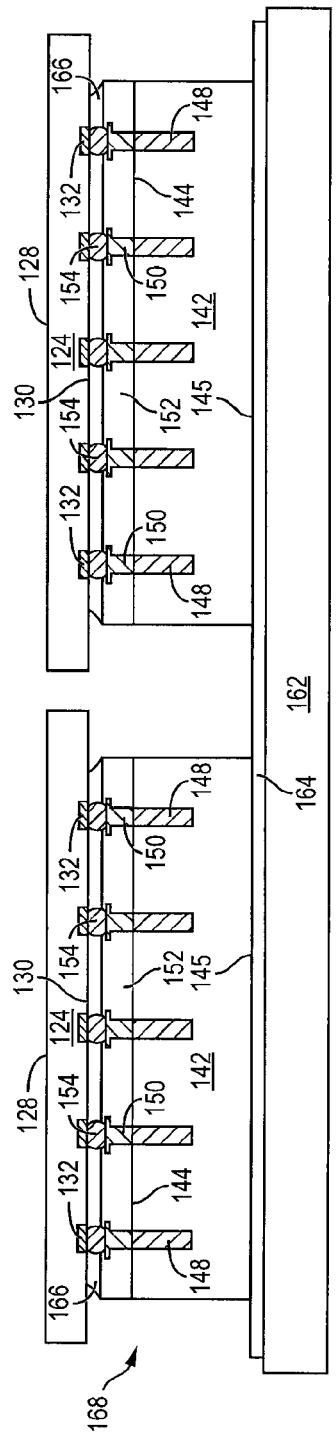
Figure 5K:
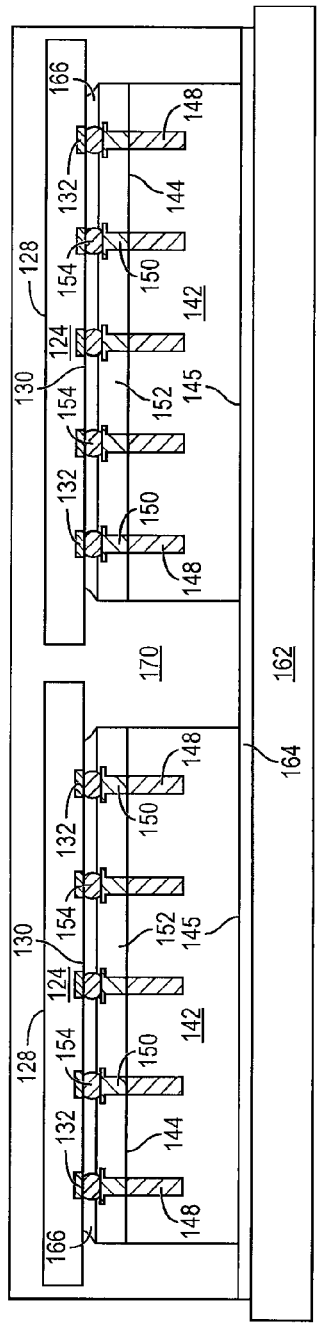
Figure 5L:
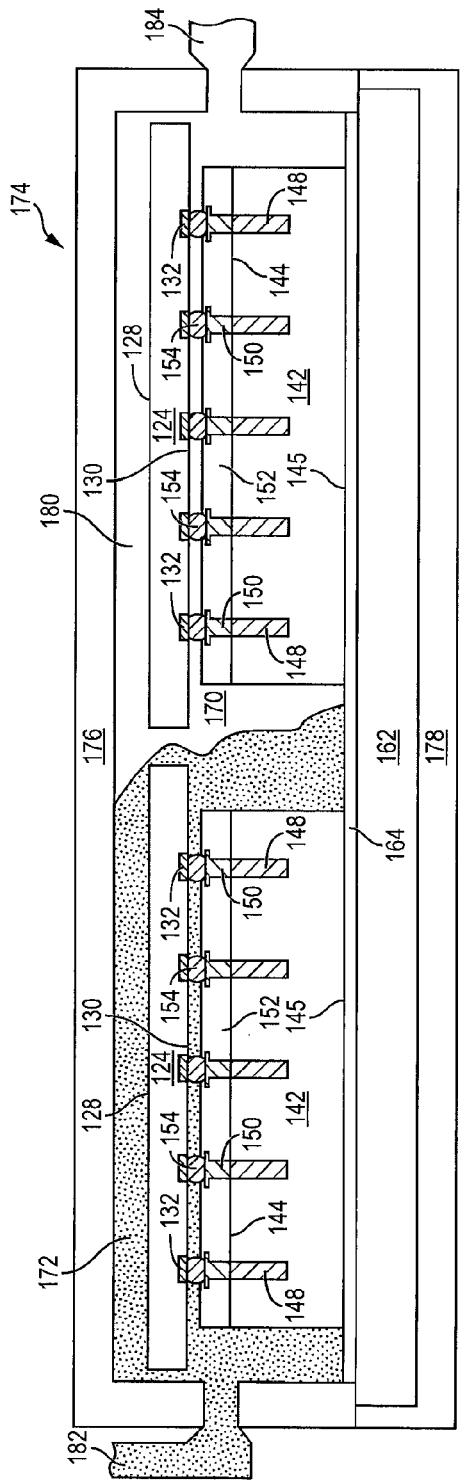
Figure 5O:
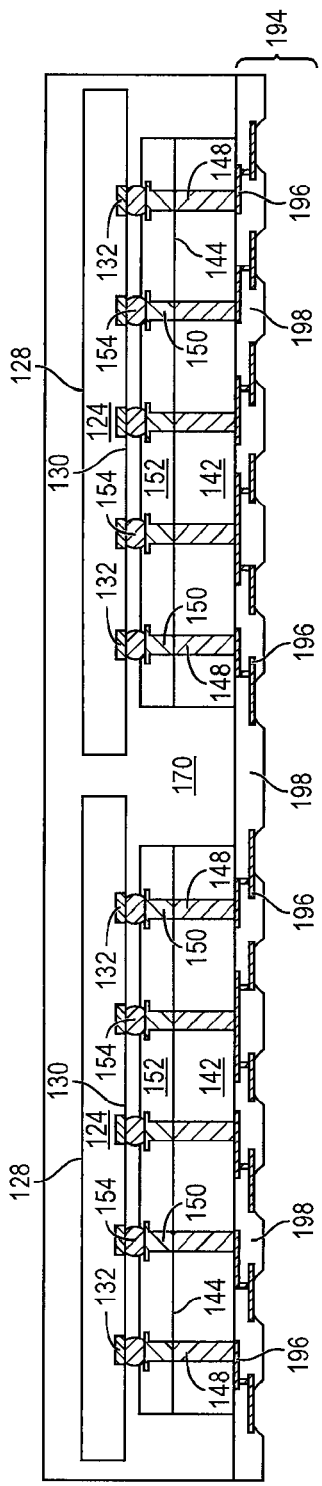
Figure 5P:
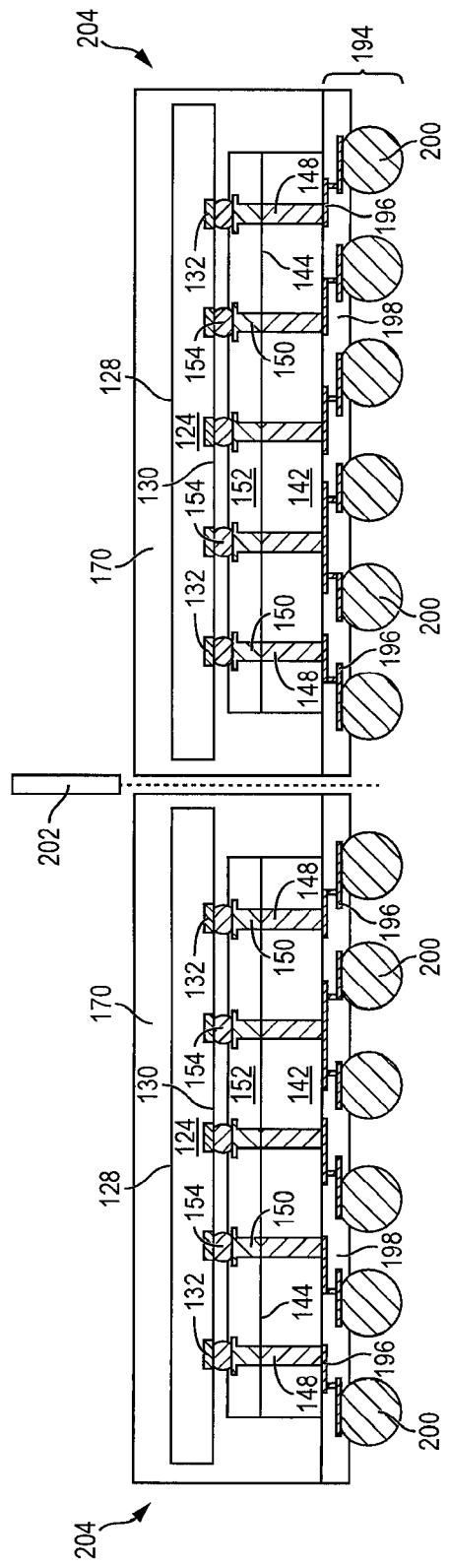

FIGS. 5a-5p illustrate, in relation to FIGS. 2 and 3a-3c, a process of bonding different size semiconductor die at the wafer level. FIG. 5a shows a semiconductor wafer or substrate 140 containing a base material, such as silicon, germanium, gallium arsenide, indium phosphide, or silicon carbide, for structural support. A plurality of semiconductor die or components 142 is formed on wafer 140 separated by inter-die wafer area or saw streets 143 as described above. Saw streets 143 provide cutting areas to singulate semiconductor wafer 140 into individual semiconductor die 142.

Each semiconductor die 142 has a back surface 145 and active surface 144 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 144 to implement analog circuits or digital circuits, such as DSP, ASIC, memory, or other signal processing circuit. Semiconductor die 142 may also contain IPDs, such as inductors, capacitors, and resistors, for RF signal processing.

In FIG. 5b, a plurality of blind vias 146 is formed partially through substrate 140 using mechanical drilling, laser drilling, or deep reactive ion etching (DRIE). Vias 146 extend from active surface 144 partially but not completely through substrate 140. In one embodiment, vias 146 are cut through 60% of the thickness of substrate 140. The remaining portion of substrate 140 between vias 146 and back surface 145 provide structural support for the substrate during subsequent manufacturing processes.

In FIG. 5c, vias 146 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive through silicon vias (TSV) 148.

In FIG. 5d, an electrically conductive layer 150 is formed over active surface 144 of substrate 140 using PVD, CVD, electrolytic plating, electroless plating process, or other suitable metal deposition process. Conductive layer 150 can be one or more layers of Al, Cu, Sn, Ni, Au, Ag, or other suitable electrically conductive material. Conductive layer 150 operates as contact pads or under bump metallization (UBM) layer for electrical interconnect. Conductive layer 150 also includes redistribution layers (RDL) and z-direction conductive vias for routing electrical signals horizontally and vertically. One portion of conductive layer 150 is electrically connected to conductive vias 148. Other portions of conductive layer 150 can be electrically common or electrically isolated depending on the design and function of semiconductor die 124 and 142.

An insulating or passivation layer 152 is formed over active surface 144 of substrate 140 and around conductive layer 150 using PVD, CVD, printing, spin coating, spray coating, sintering or thermal oxidation. The insulating layer 152 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 152 is removed by an etching process through a photoresist layer (not shown) to expose conductive layer 150. Alternatively, insulating layer 152 can be formed prior to conductive layer 150.

In FIG. 5e, an electrically conductive bump material is deposited over the exposed portion of conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 154. In some applications, bumps 154 are reflowed a second time to improve electrical contact to conductive layer 150. Bumps 154 can also be compression bonded to conductive layer 150. Bumps 154 represent one type of interconnect structure that can be formed over conductive layer 150. The interconnect structure can also use stud bump, micro bump, or other electrical interconnect.

In FIG. 5f, TSV substrate 140 is singulated through saw street 143 with saw blade or laser cutting tool 158 into individual TSV semiconductor die 142. In one embodiment, TSV semiconductor die 142 contains a logic circuit.

In FIG. 5g, a temporary substrate or carrier 162 contains sacrificial base material such as silicon, polymer, beryllium oxide, or other suitable low-cost, rigid material for structural support. An interface layer or double-sided tape 164 is formed over carrier 162 as a temporary adhesive bonding film or etch-stop layer. TSV semiconductor die 142 are positioned over and mounted to interface layer 164 and carrier 162 using a pick and place operation with bumps 154 oriented away from the carrier. TSV semiconductor die 142 mounted to carrier 162 constitute a reconfigured wafer 168, as shown in FIG. 5h.

In FIG. 5i, semiconductor die 124 from FIGS. 4a-4c are mounted to TSV semiconductor die 142 using a pick and place operation with active surface 130 oriented toward the TSV semiconductor die. Bumps 154 are reflowed to electrically connect conductive layer 150 of TSV semiconductor die 142 to conductive layer 132 of semiconductor die 124 with a low temperature less than 220° C. FIG. 5j shows semiconductor die 124 metallurgically and electrically connected to TSV semiconductor die 142 at the reconstituted wafer level. Semiconductor die 124 can be a memory device with a large storage capacity while TSV semiconductor die 142 contain logic circuits that interact with the memory devices. Semiconductor die 124, by nature of the large storage capacity memory devices, has a larger footprint than TSV semiconductor die 142 containing logic circuits. In one embodiment, semiconductor die 124 has a footprint of 10 mm×10 mm in memory applications, while TSV semiconductor die 142 has a footprint of 8 mm×8 mm in mobile CPU, GPU, and baseband signal processing applications.

TSV semiconductor die 142 are positioned over carrier 162 with sufficient spacing to allow for mounting of semiconductor die 124 with an open area between the semiconductor die for depositing encapsulant down to carrier 162 and interface layer 164. An optional underfill material 166 is deposited between semiconductor die 124 and TSV semiconductor die 142 around bumps 154.

In FIG. 5k, an encapsulant or molding compound 170 is deposited at the reconstituted wafer level over and around semiconductor die 124, TSV semiconductor die 142, and carrier 162 using a paste printing, compressive molding, transfer molding, liquid encapsulant molding, vacuum lamination, spin coating, or other suitable applicator. In cases without underfill material 166, encapsulant 170 is deposited between semiconductor 124 and TSV semiconductor die 142. Encapsulant 170 can be polymer composite material, such as epoxy resin with filler, epoxy acrylate with filler, or polymer with proper filler. Encapsulant 170 is non-conductive and environmentally protects the semiconductor device from external elements and contaminants.

In another embodiment, a mold underfill (MUF) material 172 is deposited at the reconstituted wafer level over and around semiconductor die 124 and TSV semiconductor die 142 with a MUF process, as shown in FIG. 5l. Chase mold 174 has an upper mold support 176 and lower mold support 178 that are brought together to enclose semiconductor die 124 and TSV semiconductor die 142 with open space 180. MUF material 172 in a liquid state is injected into one side of chase mold 174 with nozzle 182 while an optional vacuum assist 184 draws pressure from the opposite side to uniformly fill open space 180 around semiconductor die 124 and TSV semiconductor die 142 with the MUF material. MUF material 172 can be polymer composite material, such as epoxy resin with filler, epoxy acrylate with filler, or polymer with proper filler. MUF material 172 is formed around and between semiconductor die 124 and TSV semiconductor die 142 and cured, as shown in FIG. 5m.

Continuing from FIG. 5k, carrier 162 and interface layer 164 are removed by chemical etching, mechanical peeling, CMP, mechanical grinding, thermal bake, UV light, laser scanning, or wet stripping to expose back surface 145 of semiconductor die 142, as shown in FIG. 5n. A portion of the base material of substrate 140 and encapsulant 170 or MUF material 172 is removed by grinder 190 to expose conductive vias 148.

FIG. 5o shows semiconductor die 124 and TSV semiconductor die 142 covered by encapsulant 170 or MUF material 172 after the grinding operation. A build-up interconnect structure 194 is formed over a surface of TSV semiconductor die 142 opposite semiconductor die 124. The build-up interconnect structure 194 includes an electrically conductive layer or RDL 196 formed using a patterning and metal deposition process such as sputtering, electrolytic plating, and electroless plating. Conductive layer 196 can be one or more layers of Al, Cu, Sn, Ni, Au, Ag, or other suitable electrically conductive material. Conductive layer 196 includes horizontal and vertical portions for electrical interconnect. One portion of conductive layer 196 is electrically connected to conductive vias 148. Other portions of conductive layer 196 can be electrically common or electrically isolated depending on the design and function of semiconductor die 124 and 142.

An insulating or passivation layer 198 is formed around and between conductive layer 196 for electrical isolation using PVD, CVD, printing, spin coating, spray coating, sintering or thermal oxidation. The insulating layer 198 contains one or more layers of SiO2, Si3N4, SiON, Ta2O5, Al2O3, or other material having similar insulating and structural properties. A portion of insulating layer 198 can be removed by an etching process through a photoresist layer to expose conductive layer 196 for bump formation or additional package interconnect. The build-up interconnect structure 194 is electrically connected to semiconductor die 124 by way of conductive layer 150, bumps 154, and conductive vias 148.

In FIG. 5p, an electrically conductive bump material is deposited over the exposed conductive layer 196 of build-up interconnect structure 194 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 196 using a suitable attachment or bonding process. In one embodiment, the bump material is reflowed by heating the material above its melting point to form balls or bumps 200. In some applications, bumps 200 are reflowed a second time to improve electrical contact to conductive layer 196. A UBM layer can be formed under bumps 200. Bumps 200 can also be compression bonded to conductive layer 196. Bumps 200 represent one type of interconnect structure that can be formed over conductive layer 196. The interconnect structure can also use stud bump, micro bump, or other electrical interconnect.

Semiconductor die 124 are singulated through encapsulant 170 and build-up interconnect structure 194 with saw blade or laser cutting tool 202 into individual fan-out wafer level chip scale package (Fo-WLCSP) or embedded wafer level ball grid array (eWLB) 204. FIG. 6 shows Fo-WLCSP 204 after singulation. Semiconductor die 124 can be larger than TSV semiconductor die 142, particularly in cases where the semiconductor die is a memory device with a large storage capacity and for high node technology, e.g., 32-40 nanometers (nm). By forming a reconstituted wafer and mounting TSV semiconductor die 142 to carrier 162 with sufficient spacing, the larger semiconductor die 124 can be bonded to the TSV semiconductor die at the reconstituted wafer level with an open area to deposit encapsulant 170 or MUF material 172 between the semiconductor die and TSV semiconductor die. The build-up interconnect structure 194 is also formed at the reconstituted wafer level. The reconstituted wafer with encapsulant 170 protects semiconductor die 124 and provides support for the formation of build-up interconnect structure 194. The reconstituted wafer-level encapsulation and interconnect structure formation also reduces risk of handling damage and cracking, as well as providing a simple and low cost manufacturing process. The backgrinding of TSV semiconductor die 142 exposes conductive vias 148 for vertical interconnect and reduces the thickness of Fo-WLCSP 204.

Semiconductor die 124 is electrically connected through bumps 154, conductive layer 150, and conductive vias 148 to build up interconnect structure 194. TSV semiconductor die 142 with conductive vias 148, conductive layer 150, insulating layer 152, and bumps 154 provide a simple and cost effective structure for vertical interconnect of semiconductor die 124, as well as efficient package stacking through the conductive layers of the TSV semiconductor die and build-up interconnect structure 194. Since TSV semiconductor die 142 can be made with similar material as semiconductor die 124 and build-up interconnect structure 194 is formed over a surface of the TSV semiconductor die 142 opposite semiconductor die 124 and encapsulant 170, TSV semiconductor die 142 negates CTE mismatch between the semiconductor die and build-up interconnect structure. TSV semiconductor die 142 operates as a buffer between semiconductor die 124 on one side of the TSV semiconductor die and build-up interconnect structure 194 on an opposite side of the TSV semiconductor die to reduce warpage. TSV semiconductor die 142 provides fine pitch vertical interconnect for semiconductor die 124 suitable for high I/O count applications.

Figure 7F:
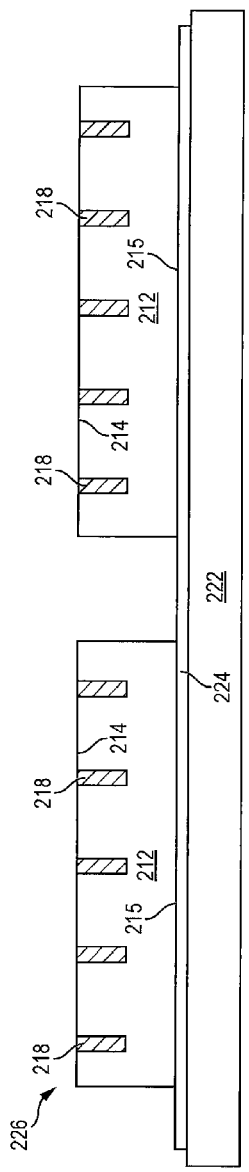
FIGS. 7a-7q illustrate another process of bonding different size semiconductor die at the wafer level.
Figure 7G:
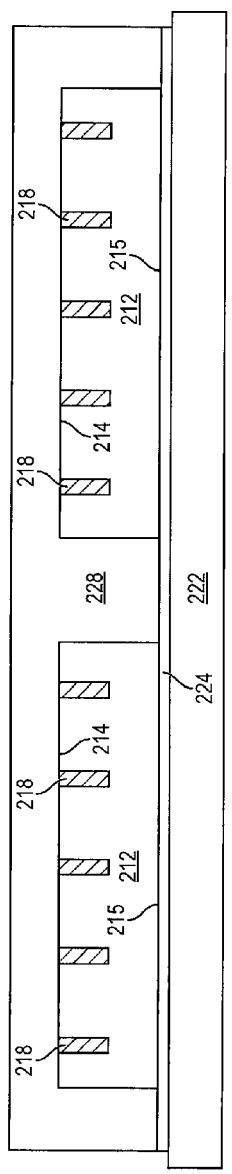
Figure 7H:
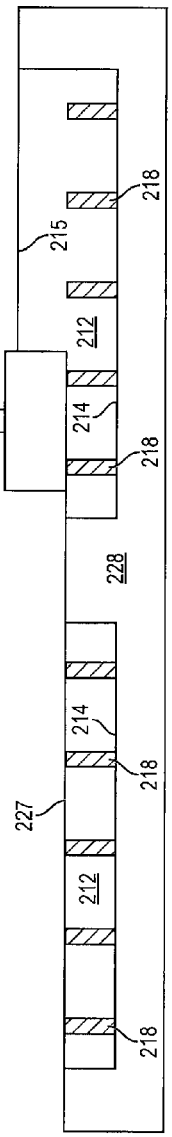
Figure 7I:
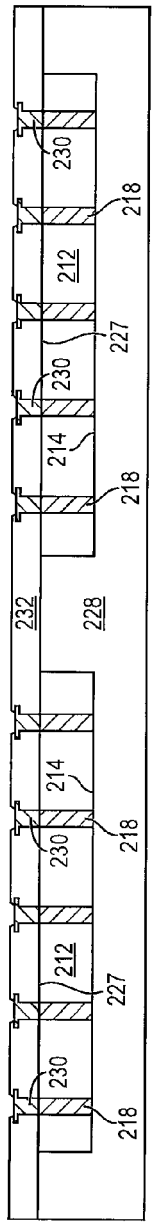
Figure 7J:
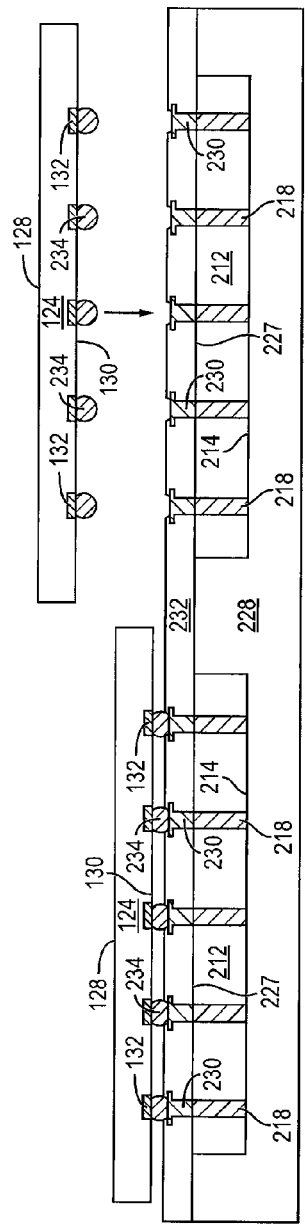
Figure 7K:
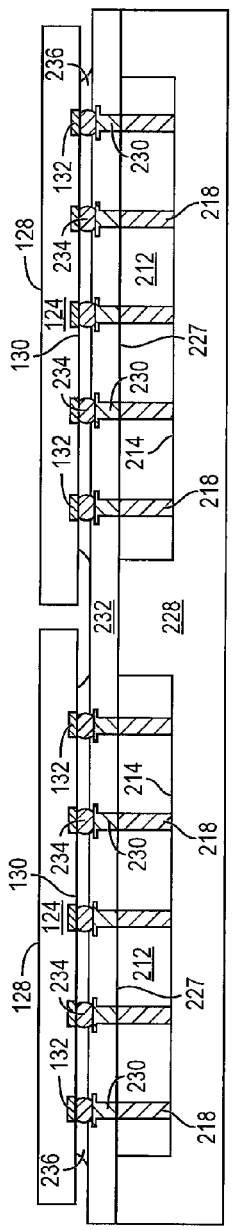
Figure 7L:
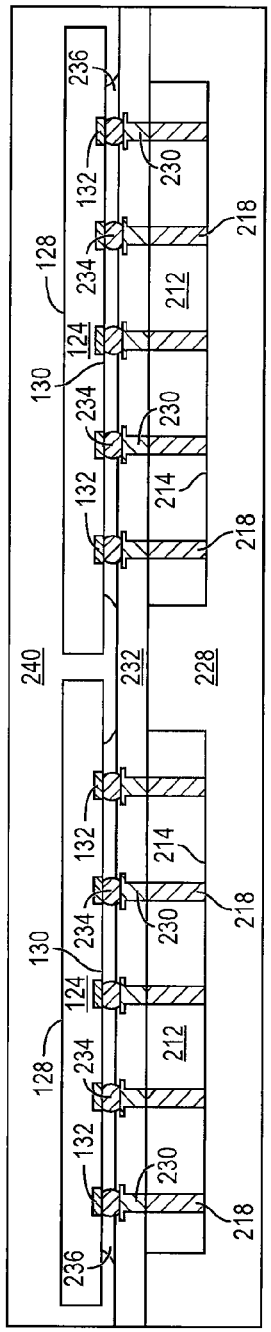
Figure 7M:
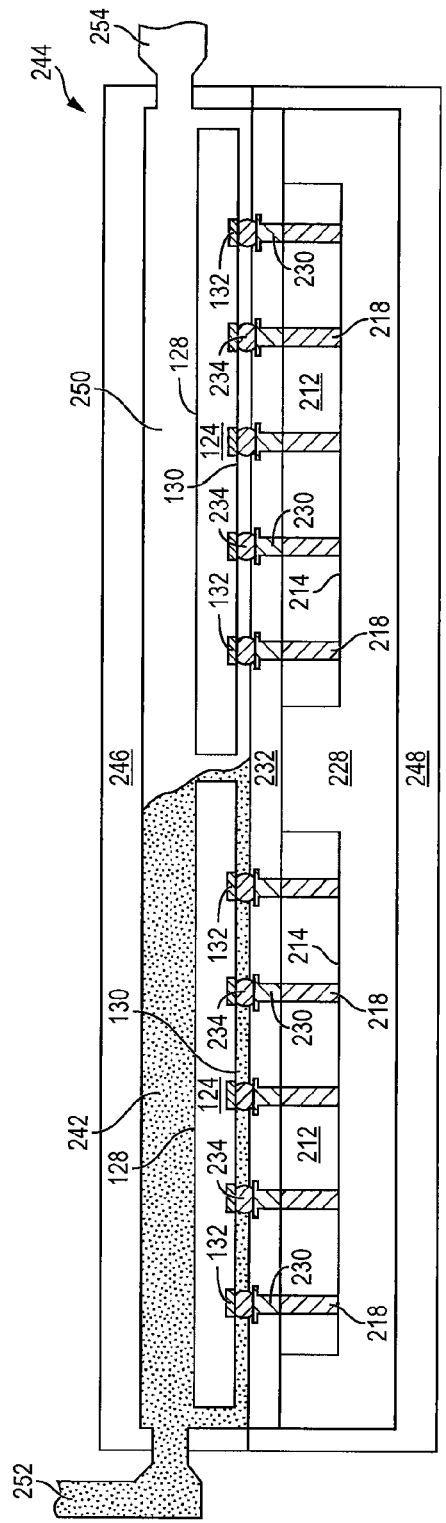
Figure 7N:
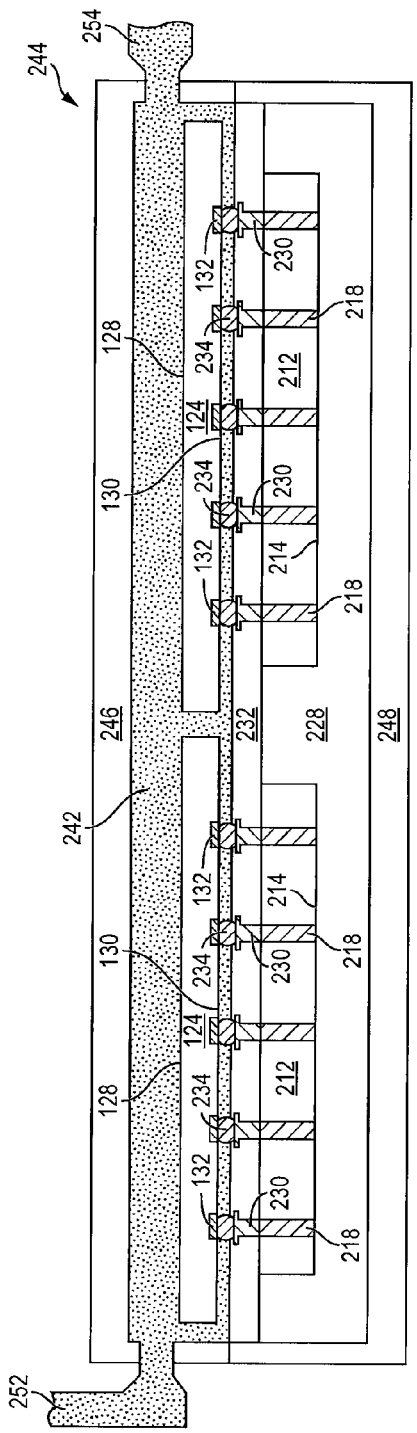
Figure 7O:
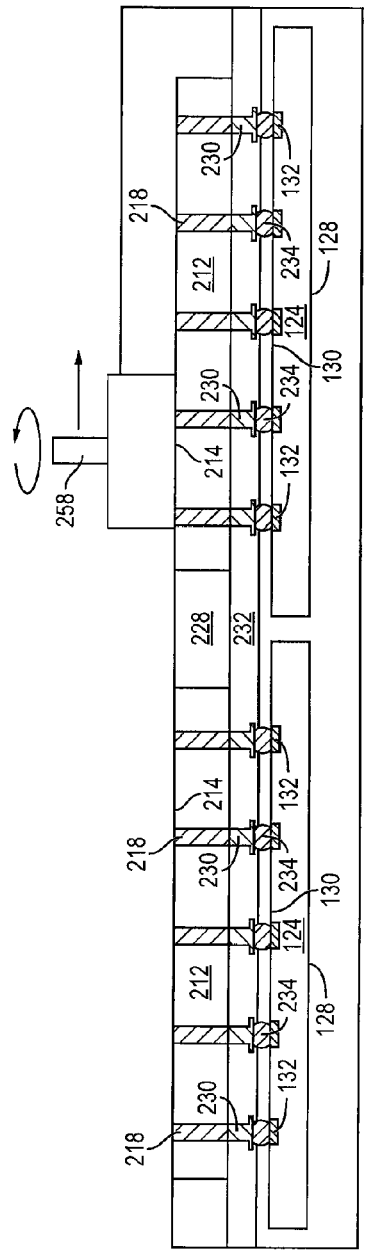
Figure 7P:
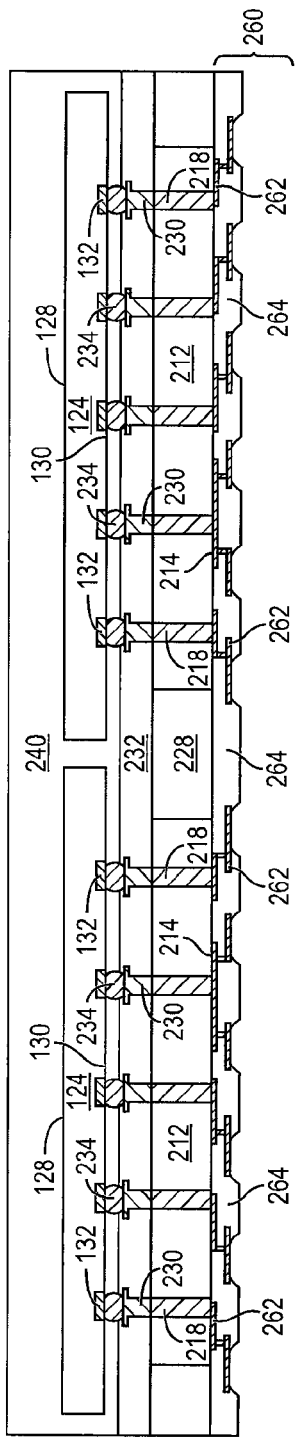
Figure 7Q:
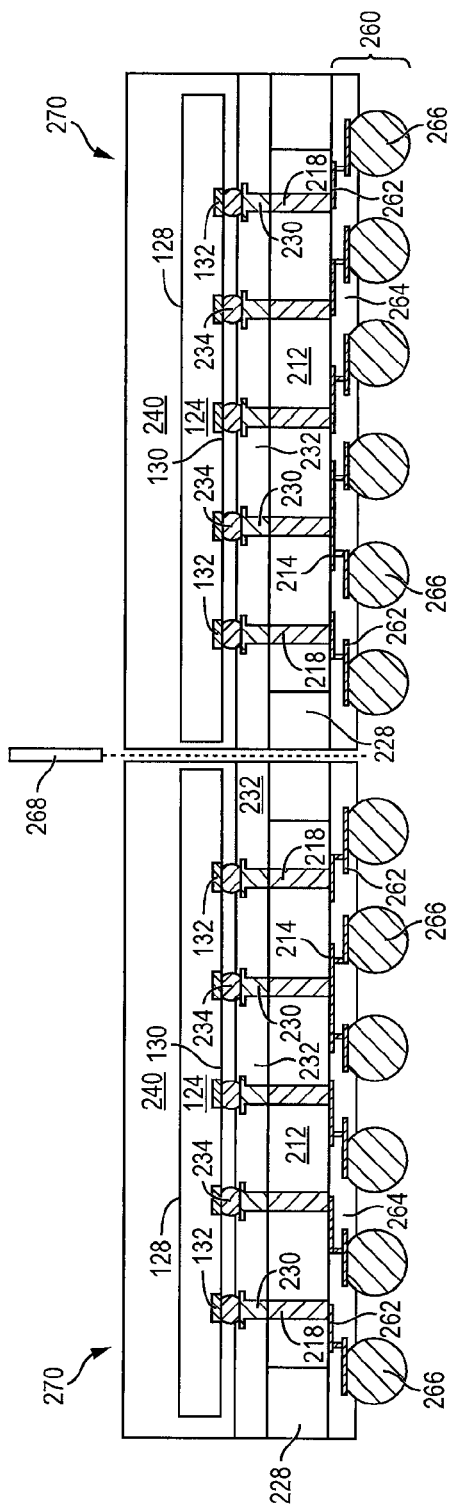

FIGS. 7a-7q illustrate, in relation to FIGS. 2 and 3a-3c, another process of bonding different size semiconductor die at the wafer level. FIG. 7a shows a semiconductor wafer or substrate 210 containing a base material, such as silicon, germanium, gallium arsenide, indium phosphide, or silicon carbide, for structural support. A plurality of semiconductor die or components 212 is formed on wafer 210 separated by inter-die wafer area or saw streets 213 as described above. Saw streets 213 provide cutting areas to singulate semiconductor wafer 210 into individual semiconductor die 212.

Each semiconductor die 212 has a back surface 215 and active surface 214 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 214 to implement analog circuits or digital circuits, such as DSP, ASIC, memory, or other signal processing circuit. Semiconductor die 212 may also contain IPDs, such as inductors, capacitors, and resistors, for RF signal processing.

In FIG. 7b, a plurality of blind vias 216 is formed partially through substrate 210 using mechanical drilling, laser drilling, or DRIE. Vias 216 extend from surface 212 partially but not completely through substrate 210. In one embodiment, vias 216 are cut through 60% of the thickness of substrate 210. The remaining portion of substrate 210 between vias 216 and back surface 215 provide structural support for the substrate during subsequent manufacturing processes.

In FIG. 7c, vias 216 are filled with Al, Cu, Sn, Ni, Au, Ag, Ti, W, poly-silicon, or other suitable electrically conductive material using electrolytic plating, electroless plating process, or other suitable metal deposition process to form z-direction conductive TSV 218.

In FIG. 7d, TSV substrate 210 is singulated through saw street 213 with saw blade or laser cutting tool 219 into individual TSV semiconductor die 212. In one embodiment, TSV semiconductor die 212 contains a logic circuit.

In FIG. 7e, a temporary substrate or carrier 222 contains sacrificial base material such as silicon, polymer, beryllium oxide, or other suitable low-cost, rigid material for structural support. An interface layer or double-sided tape 224 is formed over carrier 222 as a temporary adhesive bonding film or etch-stop layer. TSV semiconductor die 212 are positioned over and mounted to interface layer 224 and carrier 222 using a pick and place operation with back surface 215 oriented toward the carrier. TSV semiconductor die 212 mounted to carrier 162 constitute a reconfigured wafer 226, as shown in FIG. 7f.

In FIG. 7g, an encapsulant or molding compound 228 is deposited at the reconstituted wafer level over TSV semiconductor die 212 and carrier 222 using a paste printing, compressive molding, transfer molding, liquid encapsulant molding, vacuum lamination, spin coating, or other suitable applicator. Encapsulant 228 can be polymer composite material, such as epoxy resin with filler, epoxy acrylate with filler, or polymer with proper filler. Encapsulant 228 is non-conductive and environmentally protects the semiconductor device from external elements and contaminants.

In FIG. 7h, carrier 222 and interface layer 224 are removed by chemical etching, mechanical peeling, CMP, mechanical grinding, thermal bake, UV light, laser scanning, or wet stripping to expose back surface 215 of substrate 210. A portion of the base material of substrate 210 and encapsulant 228 is removed by grinder 229 to expose conductive vias 218.

In FIG. 7i, an electrically conductive layer 230 is formed over surface 227 of TSV semiconductor die 212 using PVD, CVD, electrolytic plating, electroless plating process, or other suitable metal deposition process. Conductive layer 230 can be one or more layers of Al, Cu, Sn, Ni, Au, Ag, or other suitable electrically conductive material. Conductive layer 230 operates as contact pads or UBM layer for electrical interconnect. Conductive layer 230 also includes redistribution layers and z-direction conductive vias for routing electrical signals horizontally and vertically. One portion of conductive layer 230 is electrically connected to conductive vias 218. Other portions of conductive layer 230 can be electrically common or electrically isolated depending on the design and function of semiconductor die 124 and 212.

An insulating or passivation layer 232 is formed over surface 227 of TSV semiconductor die 212 and around conductive layer 230 using PVD, CVD, printing, spin coating, spray coating, sintering or thermal oxidation. The insulating layer 232 contains one or more layers of SiO2, Si3N4, SiON, Ta2O5, Al2O3, or other material having similar insulating and structural properties. A portion of insulating layer 232 is removed by an etching process through a photoresist layer to expose conductive layer 230. Alternatively, insulating layer 232 can be formed prior to conductive layer 230.

In FIG. 7j, semiconductor die 124 from FIGS. 4a-4c, in this case with bumps 234, are mounted to TSV semiconductor die 212 using a pick and place operation with active surface 130 oriented toward the TSV semiconductor die. Bumps 234 are reflowed to electrically connect conductive layer 230 to conductive layer 132 of semiconductor die 124 with a low temperature less than 220° C. FIG. 7k shows semiconductor die 124 metallurgically and electrically connected to TSV semiconductor die 212 at the reconstituted wafer level. Semiconductor die 124 can be a memory device with a large storage capacity while TSV semiconductor die 212 contain logic circuits that interact with the memory devices. Semiconductor die 124, by nature of the large storage capacity memory devices, has a larger footprint than TSV semiconductor die 212 containing logic circuits. In one embodiment, semiconductor die 124 has a footprint of 10 mm×10 mm in memory applications, while TSV semiconductor die 212 has a footprint of 8 mm×8 mm in mobile CPU, GPU, and baseband signal processing applications. TSV semiconductor die 212 are positioned with sufficient spacing to allow for mounting of semiconductor die 124 with an open area between the semiconductor die for depositing encapsulant down to conductive layer 230 and insulating layer 232. An optional underfill material 236 is deposited between semiconductor die 124 and TSV semiconductor die 212 around bumps 234.

In FIG. 7l, an encapsulant or molding compound 240 is deposited at the reconstituted wafer level over and around semiconductor die 124 and TSV semiconductor die 212 using a paste printing, compressive molding, transfer molding, liquid encapsulant molding, vacuum lamination, spin coating, or other suitable applicator. In cases without underfill material 236, encapsulant 240 is deposited between semiconductor 124 and TSV semiconductor die 212. Encapsulant 240 can be polymer composite material, such as epoxy resin with filler, epoxy acrylate with filler, or polymer with proper filler. Encapsulant 240 is non-conductive and environmentally protects the semiconductor device from external elements and contaminants.

In another embodiment, a MUF material 242 is deposited over and around semiconductor die 124 and TSV semiconductor die 212 at the wafer level with a MUF process, as shown in FIG. 7m. Chase mold 244 has an upper mold support 246 and lower mold support 248 that are brought together to enclose semiconductor die 124 and TSV semiconductor die 212 with open space 250. MUF material 242 in a liquid state is injected into one side of chase mold 244 with nozzle 252 while an optional vacuum assist 254 draws pressure from the opposite side to uniformly fill open space 250 around semiconductor die 124 and TSV semiconductor die 212 with the MUF material. MUF material 242 can be polymer composite material, such as epoxy resin with filler, epoxy acrylate with filler, or polymer with proper filler. MUF material 242 is formed around and between semiconductor die 124 and TSV semiconductor die 212 and cured, as shown in FIG. 7n.

In FIG. 7o, a portion of encapsulant 228 is removed by grinder 258 to expose conductive vias 218.

FIG. 7p shows semiconductor die 124 and TSV semiconductor die 212 surrounded by encapsulant 240 or MUF material 242 after the grinding operation. A build-up interconnect structure 260 is formed over active surface 214 of TSV semiconductor die 212 opposite semiconductor die 124. The build-up interconnect structure 260 includes an electrically conductive layer or RDL 262 formed using a patterning and metal deposition process such as sputtering, electrolytic plating, and electroless plating. Conductive layer 262 can be one or more layers of Al, Cu, Sn, Ni, Au, Ag, or other suitable electrically conductive material. Conductive layer 262 includes horizontal and vertical portions for electrical interconnect. One portion of conductive layer 262 is electrically connected to conductive vias 218. Other portions of conductive layer 262 can be electrically common or electrically isolated depending on the design and function of semiconductor die 124 and 212.

An insulating or passivation layer 264 is formed around and between conductive layer 262 for electrical isolation using PVD, CVD, printing, spin coating, spray coating, sintering or thermal oxidation. The insulating layer 264 contains one or more layers of SiO2, Si3N4, SiON, Ta2O5, Al2O3, or other material having similar insulating and structural properties. A portion of insulating layer 264 can be removed by an etching process through a photoresist layer to expose conductive layer 262 for bump formation or additional package interconnect. The build-up interconnect structure 260 is electrically connected to semiconductor die 124 by way of conductive layer 230, bumps 234, and conductive vias 218.

In FIG. 7q, an electrically conductive bump material is deposited over the exposed conductive layer 262 of build-up interconnect structure 260 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 262 using a suitable attachment or bonding process. In one embodiment, the bump material is reflowed by heating the material above its melting point to form balls or bumps 266. In some applications, bumps 266 are reflowed a second time to improve electrical contact to conductive layer 262. A UBM layer can be formed under bumps 266. Bumps 266 can also be compression bonded to conductive layer 262. Bumps 266 represent one type of interconnect structure that can be formed over conductive layer 262. The interconnect structure can also use stud bump, micro bump, or other electrical interconnect.

Figure 8:
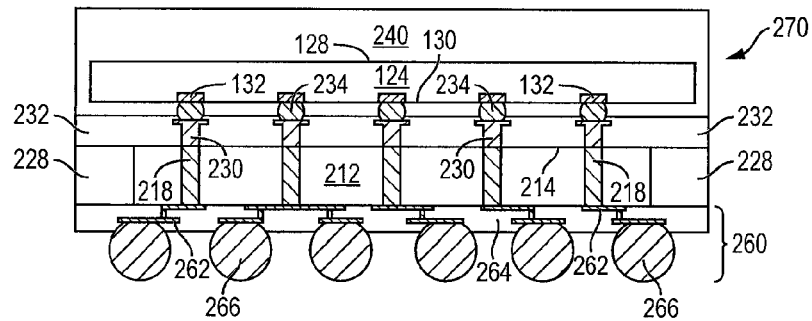
FIG. 8 illustrates a Fo-WLCSP with different size semiconductor die bonded together according to FIGS. 7a-7q.

Semiconductor die 124 are singulated through encapsulant 240 and build-up interconnect structure 260 with saw blade or laser cutting tool 268 into individual Fo-WLCSP or eWLB 270. FIG. 8 shows Fo-WLCSP 270 after singulation. Semiconductor die 124 can be larger than TSV semiconductor die 212, particularly in cases where the semiconductor die is a memory device with a large storage capacity and for high node technology, e.g., 32-40 nm. By forming a reconstituted wafer and mounting TSV semiconductor die 212 to carrier 222 with sufficient spacing, the larger semiconductor die 124 can be bonded to TSV semiconductor die 212 at the reconstituted wafer level with an open area to deposit encapsulant 240 or MUF material 242 between semiconductor die 124 and TSV semiconductor die 212. The build-up interconnect structure 260 is also formed at the reconstituted wafer level. The reconstituted wafer with encapsulant 240 protects semiconductor die 124 and provides support for the formation of build-up interconnect structure 260. The reconstituted wafer-level encapsulation and interconnect structure formation also reduces risk of handling damage and cracking, as well as providing a simple and low cost manufacturing process. The backgrinding of substrate 210 exposes conductive vias 218 for vertical interconnect and reduces the thickness of Fo-WLCSP 270.

Semiconductor die 124 is electrically connected through bumps 234, conductive layer 230, and conductive vias 218 to build up interconnect structure 260. TSV semiconductor die 212 with conductive vias 218, conductive layer 230, insulating layer 232, and bumps 234 provide a simple and cost effective structure for vertical interconnect of semiconductor die 124, as well as efficient package stacking through the conductive layers of the TSV semiconductor die and build-up interconnect structure 260. Since TSV semiconductor die 212 can be made with similar material as semiconductor die 124 and build-up interconnect structure 260 is formed over active surface 214 of TSV semiconductor die 212 opposite semiconductor die 124 and encapsulant 240, TSV semiconductor die 212 negates CTE mismatch between semiconductor die 124 and build-up interconnect structure 260. TSV semiconductor die 212 operates as a buffer between semiconductor die 124 on one side of the TSV semiconductor die and build-up interconnect structure 260 on an opposite side of the TSV semiconductor die to reduce warpage. TSV semiconductor die 212 provides fine pitch vertical interconnect for semiconductor die 124 suitable for high I/O count applications.

Figure 9:
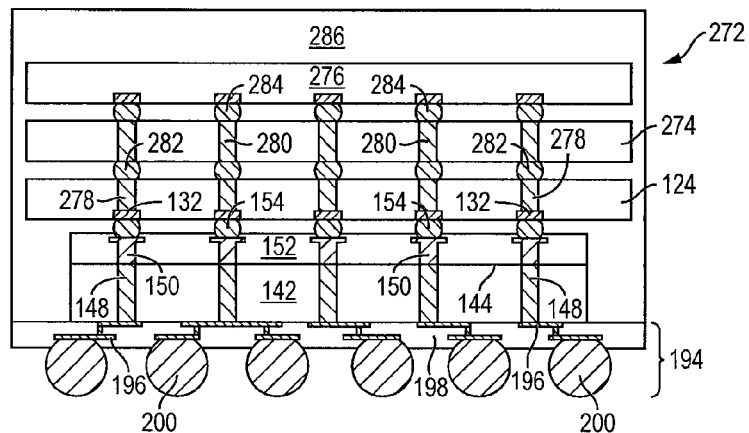
FIG. 9 illustrates three stacked semiconductor die mounted to the TSV semiconductor die.

FIG. 9 shows an embodiment of Fo-WLCSP 272, similar to FIG. 6, with multiple semiconductor die stacked over TSV semiconductor die 212. Semiconductor die 274 and 276 originate from a semiconductor wafer, similar to FIGS. 4a-4c. Each semiconductor die 274-276 has a back surface and active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 274-276 may also contain IPDs, such as inductors, capacitors, and resistors, for RF signal processing. A plurality of contact pads is formed over the active surface and electrically connected to the circuits on the active surface. A plurality of bumps is formed over the contact pads for semiconductor die 274-276. In one embodiment, semiconductor die 274-276 are flipchip type semiconductor die.

A plurality of conductive vias 278 is formed through semiconductor die 124, typically at the wafer level in FIGS. 4a-4b, for z-direction vertical interconnect. Likewise, a plurality of conductive vias 280 is formed through semiconductor die 274 for z-direction vertical interconnect. Semiconductor die 274 is mounted to semiconductor die 124 with bumps 282 metallurgically and electrically connected to conductive vias 278. Semiconductor die 276 is mounted to semiconductor die 274 with bumps 284 metallurgically and electrically connected to conductive vias 280. In one embodiment, TSV semiconductor die 142 is a logic device or DSP and semiconductor die 124 and 274-276 are memory devices. An encapsulant 286 is deposited over and around semiconductor die 124, 274, and 276.

Figure 10:
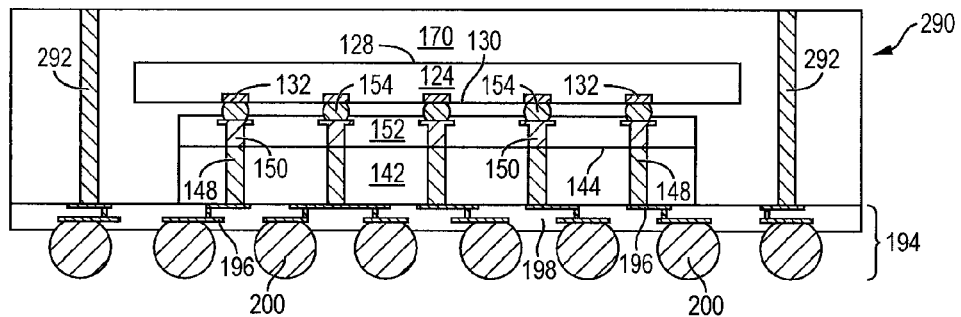
FIG. 10 illustrates a conductive via formed through the encapsulant around the TSV semiconductor die.

FIG. 10 shows an embodiment of Fo-WLCSP 290, similar to FIG. 6, with conductive vias 292 formed through encapsulant 170 for vertical electrical interconnect to build-up interconnect structure 194. A plurality of vias is formed through encapsulant 170 using laser drilling, mechanic drilling, etching, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 292.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer including an active surface and a second surface opposite the active surface;
   forming a plurality of conductive vias partially through the active surface of the semiconductor wafer;
   singulating the semiconductor wafer to separate a first semiconductor die;
   disposing a second semiconductor die over the first semiconductor die with the active surface oriented toward the second semiconductor die;
   depositing an encapsulant over and around the first and second semiconductor dies;
   removing a portion of the second surface to expose a surface of the conductive vias coplanar with the second surface and the encapsulant; and
   forming an interconnect structure over the first semiconductor die opposite the second semiconductor die, the interconnect structure including a first insulating layer and a first conductive layer.

2. The method of claim 1, wherein a footprint of the second semiconductor die is larger than a footprint of the first semiconductor die.

3. The method of claim 1, further including:
   forming a second conductive layer over the active surface of the first semiconductor die prior to mounting the second semiconductor die, the second conductive layer being electrically connected to the conductive vias; and
   forming a second insulating layer over the active surface of the first semiconductor die.

4. The method of claim 1, further including depositing a mold underfill material between the first semiconductor die and second semiconductor die.

5. The method of claim 1, wherein the second semiconductor die includes a memory device.

6. The method of claim 1, further including stacking a plurality of second semiconductor die over the first semiconductor die.

7. A method of making a semiconductor device, comprising:
   providing a first semiconductor die including an active surface and second surface;
   forming a plurality of conductive vias through the active surface of the first semiconductor die;
   forming a first interconnect structure over the active surface of the first semiconductor die;
   disposing a second semiconductor die over the first semiconductor die with the first interconnect structure between the first and second semiconductor dies, the second semiconductor die extending outside a footprint of the first semiconductor die; and
   depositing an encapsulant around the first and second semiconductor dies.

8. The method of claim 7, further including
   forming a second interconnect structure including an insulating layer and conductive layer over the first semiconductor die opposite the second semiconductor die.

9. The method of claim 7, further including:
   disposing the first semiconductor die over a carrier;
   forming the plurality of conductive vias partially through the active surface of the first semiconductor die;
   removing the carrier; and
   removing a portion of the second surface of the first semiconductor die opposite the active surface of the first semiconductor die to expose the conductive vias.

10. The method of claim 7, wherein the first interconnect structure includes an insulating layer and conductive layer, the conductive layer being electrically connected to the conductive vias.

11. The method of claim 7, further including depositing a mold underfill material between the first semiconductor die and second semiconductor die.

12. The method of claim 7, further including stacking a plurality of second semiconductor die over the first semiconductor die.

13. The method of claim 7, further including forming a plurality of conductive vias through the encapsulant.

14. The method of claim 7, wherein a footprint of the semiconductor die is larger than a footprint of the substrate.

15. A method of making a semiconductor device, comprising:
   providing a first semiconductor die including an active surface and second surface;
   forming a plurality of conductive vias through the active surface of the first semiconductor die and coplanar with the active surface of the first semiconductor die;

depositing a first encapsulant over the first semiconductor die including on the active surface;

forming an interconnect structure over the second surface of the first semiconductor die, the interconnect structure including a first insulating layer and a first conductive layer;

disposing a second semiconductor die over the first semiconductor die opposite the active surface with the interconnect structure between the first and second semiconductor dies;

depositing a second encapsulant over the second semiconductor die; and removing a portion of the first encapsulant on the active surface of the first semiconductor die.

16. The method of claim 15, wherein a footprint of the second semiconductor die is larger than a footprint of the first semiconductor die.

17. The method of claim 15, wherein the second semiconductor die includes a memory device.

18. The method of claim 15, further including depositing a mold underfill material between the first semiconductor die and second semiconductor die.

19. A method of making a semiconductor device, comprising:

providing a substrate including a plurality of conductive vias formed through the substrate;

forming an interconnect structure over the substrate, the interconnect structure including a first insulating layer and a first conductive layer;

depositing a first encapsulant around the substrate and interconnect structure;

disposing a semiconductor die over the substrate with the interconnect structure between the substrate and semiconductor die; and depositing a second encapsulant over the semiconductor die after disposing the semiconductor die over the substrate.

20. The method of claim 19, further including:

forming the plurality of conductive vias partially through the substrate; and removing a portion of the substrate to expose the conductive vias.

21. The method of claim 19, wherein the substrate includes an active surface.

22. The method of claim 19, further including depositing a mold underfill material between the substrate and semiconductor die.

23. A method of making a semiconductor device, comprising:

providing a substrate;

forming an interconnect structure over the substrate by,
(a) forming a first insulating layer over the substrate, and
(b) forming a first conductive layer over the substrate;

depositing a first encapsulant over the substrate and interconnect structure;

disposing a semiconductor die over the substrate with the interconnect structure between the substrate and semiconductor die; and depositing a second encapsulant over the semiconductor die after disposing the semiconductor die over the substrate.

24. The method of claim 23, further including:

forming a plurality of conductive vias through the substrate.

25. The method of claim 24, further including:

forming a second conductive layer over the conductive vias; and forming a second insulating layer over the second conductive layer.

26. The method of claim 23, further including depositing a mold underfill material between the semiconductor die and the first insulating layer.

27. The method of claim 23, wherein a footprint of the semiconductor die extends outside a footprint of the substrate.

28. The method of claim 23, wherein the substrate includes an active surface.

* * * * *